(12) United States Patent
Kirn

(10) Patent No.: US 6,768,375 B2
(45) Date of Patent: Jul. 27, 2004

(54) MULTI-REFERENCE HIGH ACCURACY SWITCHING AMPLIFIER EXPANSION

(75) Inventor: Larry Kirn, West Bloomfield, MI (US)

(73) Assignee: JAM Technologies, LLC, Boston, MA (US)

( * ) Notice: Subject to any disclaimer, the term of this patent is extended or adjusted under 35 U.S.C. 154(b) by 0 days.

(21) Appl. No.: 10/356,883

(22) Filed: Feb. 3, 2003

(65) Prior Publication Data

US 2003/0151456 A1 Aug. 14, 2003

Related U.S. Application Data

(63) Continuation-in-part of application No. 09/831,595, filed as application No. PCT/US99/26691 on Nov. 12, 1999, now Pat. No. 6,535,058.
(60) Provisional application No. 60/107,948, filed on Nov. 12, 1998.

(51) Int. Cl.[7] .............................. H03F 3/38; H03F 3/217
(52) U.S. Cl. ...................... 330/10; 330/251; 330/207 A
(58) Field of Search ........................ 330/10, 251, 207 A

(56) References Cited

U.S. PATENT DOCUMENTS

| | | | | |
|---|---|---|---|---|
| 4,403,197 A | * | 9/1983 | Swanson | 330/10 |
| 4,404,526 A | | 9/1983 | Kirn | 330/10 |
| 4,733,342 A | | 3/1988 | Mueller et al. | 363/132 |
| 4,773,096 A | | 9/1988 | Kirn | 381/120 |
| 5,113,145 A | | 5/1992 | Ideler et al. | 330/251 |
| 5,309,297 A | | 5/1994 | Funahashi | 360/67 |
| 5,311,136 A | | 5/1994 | Takahashi | 324/322 |
| 5,398,003 A | | 3/1995 | Heyl et al. | 330/10 |
| 5,559,467 A | * | 9/1996 | Smedley | 330/10 |
| 5,610,553 A | | 3/1997 | Kirn | 330/10 |
| 5,613,010 A | | 3/1997 | Heyl et al. | 381/117 |
| 5,617,058 A | | 4/1997 | Adrian et al. | 330/10 |
| 5,777,512 A | | 7/1998 | Tripathi et al. | 330/207 A |
| 5,777,519 A | * | 7/1998 | Simopoulos | 330/297 |
| 5,886,572 A | | 3/1999 | Myers et al. | 330/10 |
| 5,909,153 A | | 6/1999 | Delano et al. | 332/107 |
| 5,909,496 A | | 6/1999 | Kishigami et al. | 381/111 |
| 5,949,282 A | | 9/1999 | Nguyen et al. | 330/10 |
| 6,150,880 A | | 11/2000 | Schweighofer | 330/207 A |
| 6,281,767 B1 | | 8/2001 | Lastrucci | 333/167 |
| 6,441,685 B1 | | 8/2002 | MacMillan | 330/10 |

OTHER PUBLICATIONS

R. Erickson and R. Middlebrook; "Origins of Harmonic Distortion in Switching Amplifiers," Proceedings of the Fourth Annual International PCI Conference, 1982, pp. 57–61.

* cited by examiner

*Primary Examiner*—Patricia Nguyen
(74) *Attorney, Agent, or Firm*—Gifford, Krass, Groh, Sprinkle, Anderson & Citkowski, PC

(57) ABSTRACT

The filtered output of multiple possible voltage levels are AC-coupled to a load. An incoming data stream provides input to a pulsewidth modulator which issues control voltages to three or more switching devices, respectively. A first switching device provides a controlled connection to the incoming power supply (V+), a second switching device provides a controlled connection to a lower reference voltage (VR), and a third switching device provides a controlled connection to common, or ground. The common connection of switching devices provides an input to an inductor, which, in conjunction with a capacitor removes out-of-band components before presentation of the output to one side of load. Another capacitor provides a pseudo-ground for the second side of load in a manner consistent with the art of AC-coupled power amplifiers.

1 Claim, 2 Drawing Sheets

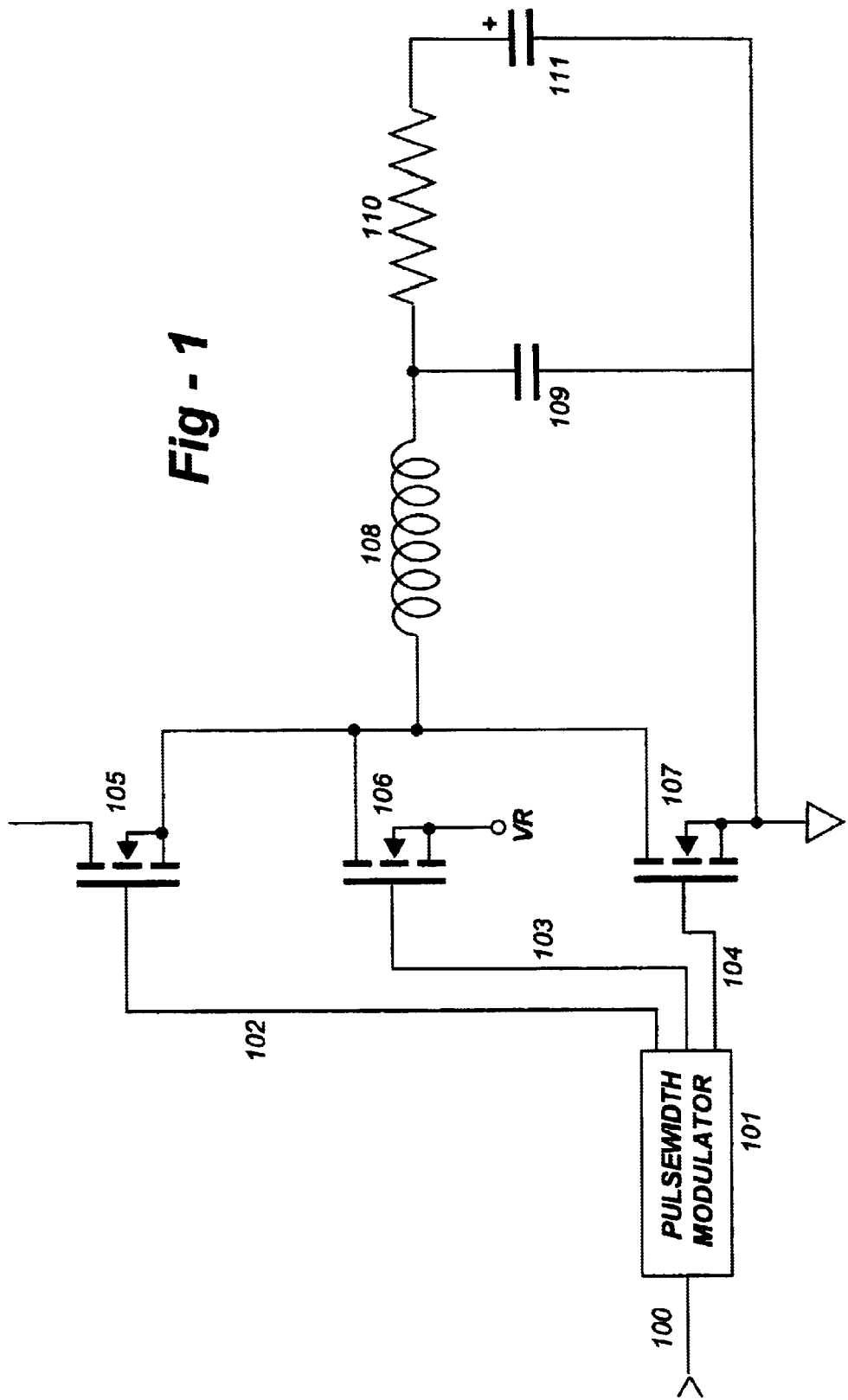

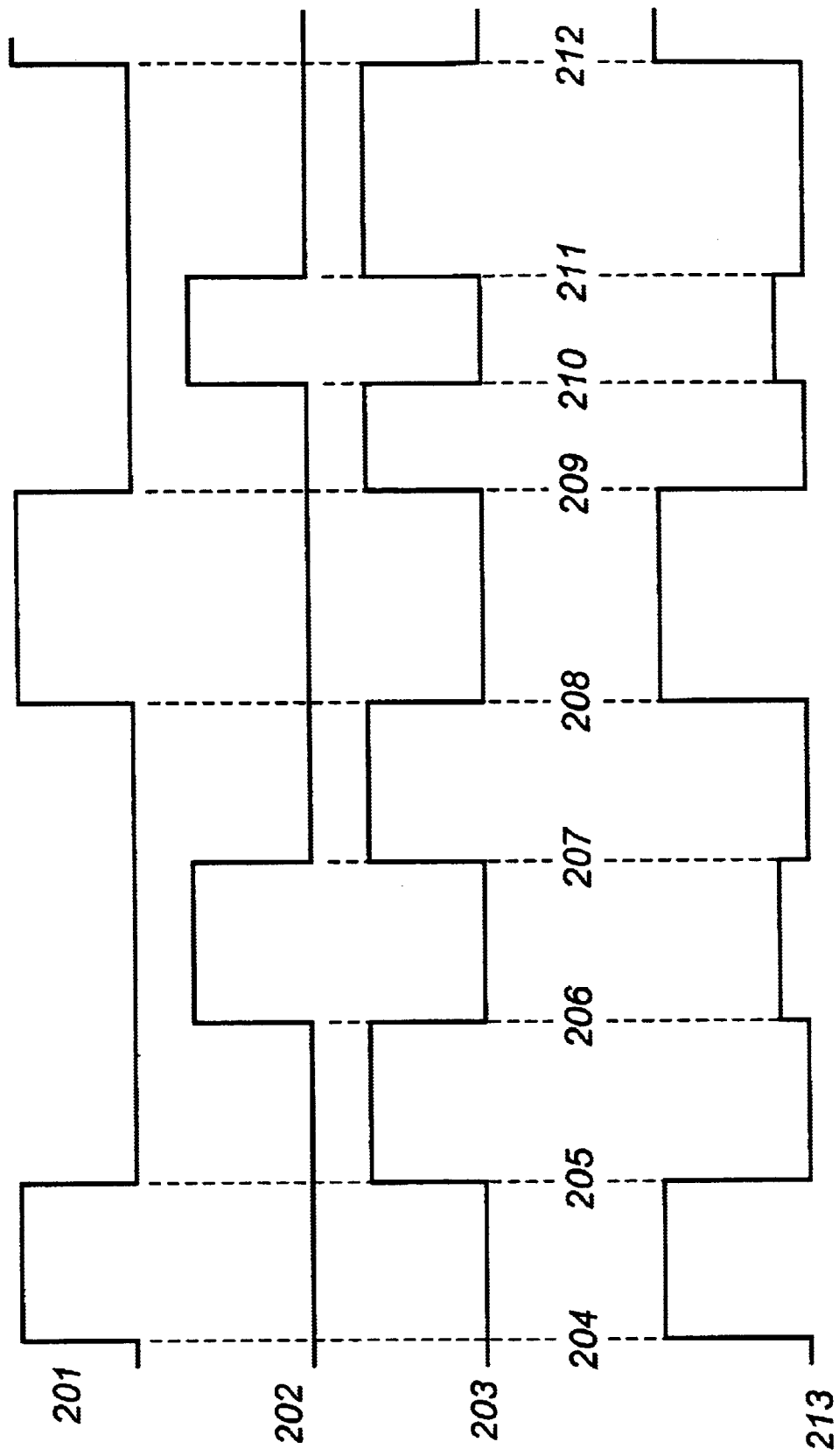

MULTI-REFERENCE HIGH ACCURACY SWITCHING AMPLIFIER EXPANSION

REFERENCE TO RELATED APPLICATIONS

This application is a continuation-in-part of U.S. patent application Ser. No. 09/831,595, filed May 11, 2000, now U.S. Pat. No. 6,535,058 which is the U.S. National Phase of PCT/US99/26691, filed Nov. 12, 1999, which claims priority from U.S. Provisional Patent Application Serial No. 60/107,948, filed Nov. 12, 1998. The entire content of each application is incorporated herein by reference.

FIELD OF THE INVENTION

The present invention resides in use of time domain multiplexing to effect the summation necessary for use of multiple references in a multi-reference amplifier.

BACKGROUND OF THE INVENTION

Multi-reference amplifiers improve resolution available to the load by the summation of multiple voltages which are individually modulated. My co-pending U.S. patent application Ser. No. 09/831,595 shows use of a bridged-tied load output to perform continuous load summation to this end. In some applications, however, cost or other factors preclude the use of a bridged output stage. A need exists for a simple, more cost-effective output stage capable of multi-reference operation.

SUMMARY OF THE INVENTION

The filtered output of multiple possible voltage levels are AC-coupled to a load. An incoming data stream provides input to a pulsewidth modulator which issues control voltages to three or more switching devices, respectively. A first switching device provides a controlled connection to the incoming power supply (V+), a second switching device provides a controlled connection to a lower reference voltage (VR), and a third switching device provides a controlled connection to common, or ground. The common connection of switching devices provides an input to an inductor, which, in conjunction with a capacitor removes out-of-band components before presentation of the output to one side of load. Another capacitor provides a pseudo-ground for the second side of load in a manner consistent with the art of AC-coupled power amplifiers.

BRIEF DESCRIPTION OF THE DRAWINGS

FIG. 1 shows circuitry including output stage of a preferred embodiment incorporating the present invention; and FIG. 2 shows the control voltage and resultant output waveforms of the circuitry of FIG. 1.

DETAILED DESCRIPTION OF THE INVENTION

Referring now to FIG. 1, incoming data stream 100 provides input to pulsewidth modulator 101, which issues control voltages 102, 103, and 104 to switching devices 105, 106, and 107, respectively. Switching device 105 provides controlled connection to the incoming power supply V+; switching device 106 provides controlled connection to a lower reference voltage VR; and switching device 107 provides controlled connection to common, or ground.

The common connection of switching devices 105, 106, and 107 provides input to inductor 108, which, in conjunction with capacitor 109, removes out-of-band components before presentation of the output to one side of load 110. Capacitor 111 provides a pseudo-ground for the second side of load 110, in a manner consistent with the art of AC-coupled power amplifiers.

By use of the FIG. 1 circuitry described, it can be seen that the filtered output of three possible voltage levels is supplied to the AC-coupled load 110.

Referring now to FIG. 2, control voltages 201, 202, and 203 represent control voltages 102, 103, and 104, respectively, of FIG. 1. Voltage 213 shows resultant voltage at the common junction of switching devices 102, 103, and 104, and Inductor 108, all of FIG. 1. Note that control voltage 203 is asserted whenever neither control voltage 201 nor 202 are asserted. In that control voltage 203 controls connection to ground, quiescent state is therefore ground, indicated by minimum level in voltage 213. At time 204, switching device 102 is asserted, supplying V+ to inductor 108.

At time 205, switching device 102 is deasserted, yielding a grounded output. At time 206, switching device 103 is asserted, supplying VR to Inductor 108. Subsequently, at time 207, switching device 103 is deasserted, again yielding a grounded output. The interval between time 204 and time 208 is considered to be one sample period of the amplifier, comprised of multiplexed coarse resolution/high voltage modulation between time 204 and time 206, and fine resolution/low voltage modulation between time 206 and time 208. In each of these multiplexed periods, each control voltage 201 or 202 is modulated as deviation from 50 percent of its available time. Note that the intervals between times 204 and 205, 205 and 206, 206 and 207, and 207 and 208 are approximately equal. This condition represents the quiescent, or zero output of the amplifier.

As the next output sample period starts at time 208, control voltage 102 is again asserted until time 209. Note that the interval between time 208 to time 209 is longer than that between time 204 to time 205, indicating an increasing coarse data value. At time 210, switching device 103 is activated until deactivation at time 211. Note that the interval between time 210 to time 211 is shorter than that between time 206 to time 207, indicating a decreasing fine data value.

By visually integrating the two output sample periods between time 204 to 208 and time 208 to 212, basic output of the amplifier can be seen. Although equal time division multiplexing is illustrated, alternative methods are anticipated.

I claim:

1. Switching amplifier output stage circuitry coupling the output of a pulsewidth modulator to a load comprising:
   a plurality of switching devices, including:
      a first switching device providing a controlled connection to the load from a first positive voltage reference,
      a second switching device providing controlled connection to the load from a second positive voltage reference at a potential different from the first positive voltage reference, and
      a third switching device providing controlled connection to the load to a common or ground reference,
      whereby the filtered output of the three switching devices are AC coupled to the load in response to signals from the pulsewidth modulator.

* * * * *